United States Patent
Azumi et al.

(10) Patent No.: US 9,101,066 B2
(45) Date of Patent: Aug. 4, 2015

(54) CASING AND ASSEMBLING METHOD OF CASING

(71) Applicants: Isao Azumi, Tokyo (JP); Koji Hashimoto, Tokyo (JP)

(72) Inventors: Isao Azumi, Tokyo (JP); Koji Hashimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 167 days.

(21) Appl. No.: 13/788,855

(22) Filed: Mar. 7, 2013

(65) Prior Publication Data

US 2014/0076772 A1    Mar. 20, 2014

(30) Foreign Application Priority Data

Sep. 19, 2012 (JP) .................................. 2012-205191

(51) Int. Cl.
*H05K 7/00* (2006.01)
*H05K 5/06* (2006.01)
*H05K 5/00* (2006.01)

(52) U.S. Cl.
CPC .............. *H05K 5/069* (2013.01); *H05K 5/0052* (2013.01); *Y10T 29/49213* (2015.01)

(58) Field of Classification Search
USPC ......... 361/728–730, 752, 796, 800, 816, 818; 174/325–370; 312/223.1–223.3
See application file for complete search history.

(56) References Cited

U.S. PATENT DOCUMENTS

| | | | |
|---|---|---|---|
| 5,719,746 A * | 2/1998 | Ohbuchi et al. ............... | 361/737 |
| 5,994,643 A * | 11/1999 | Saito ............................. | 174/372 |
| 6,573,448 B2 * | 6/2003 | Mayer et al. .................. | 174/481 |
| 7,144,275 B2 * | 12/2006 | Iida ............................... | 439/587 |
| 7,331,801 B1 * | 2/2008 | Eichorn ......................... | 439/79 |
| 7,561,435 B2 * | 7/2009 | Kamoshida et al. .......... | 361/752 |
| 7,570,496 B2 * | 8/2009 | Chen et al. .................... | 361/818 |
| 8,305,763 B2 * | 11/2012 | Kato .............................. | 361/752 |
| 2011/0235289 A1 | 9/2011 | Watanabe et al. | |

FOREIGN PATENT DOCUMENTS

| | | |
|---|---|---|
| JP | 60-213095 A | 10/1985 |
| JP | 5-075153 U | 10/1993 |
| JP | 3355761 B2 | 10/2002 |
| JP | 2004-327499 A | 11/2004 |
| JP | 2011-201348 A | 10/2011 |
| JP | 4892527 B2 | 12/2011 |

OTHER PUBLICATIONS

Japanese Office Action issued Aug. 27, 2013 in Patent Application No. 2012-205191.

* cited by examiner

*Primary Examiner* — Hung S Bui

(74) *Attorney, Agent, or Firm* — Sughrue Mion, PLLC; Richard C. Turner

(57) ABSTRACT

An outer circumferential groove filled with a seal material and an opposing surface portion are provided to a fit portion of a case. A tray portion opposing the opposing surface portion and an outer circumferential protruding portion entering the outer circumferential groove are provided to the fit portion of a cover. Master dimensions are set so that an outer clearance A0 between the outer circumferential groove and the outer circumferential protruding portion is always larger than an inner clearance C0 between the former and the latter when center positions of the cover and the case coincide with each other.

8 Claims, 9 Drawing Sheets

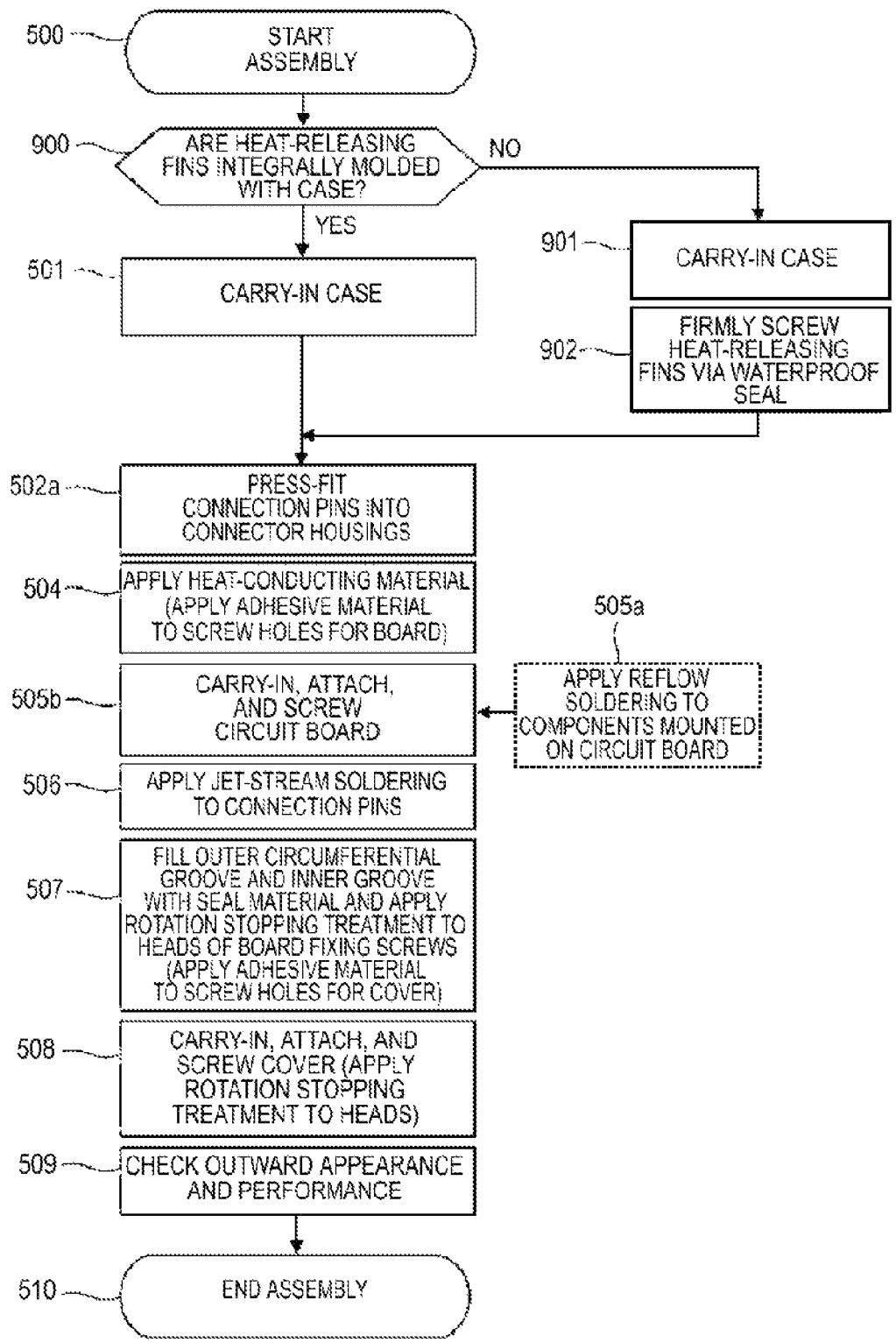

CASING AND ASSEMBLING METHOD OF CASING

BACKGROUND OF THE INVENTION

1. Field of the Invention

The present invention relates to a casing suitably used, for example, for an in-vehicle electronic control unit in which a circuit board is stored, and therefore, for which a waterproof property is required, and to an assembling method of such a casing.

2. Background Art

There is an electronic control unit including a circuit board on which heating components are mounted and which is hermetically stored in a casing formed of a case and a cover. Heat generated in the heating components is transmitted to the case by contact heat transfer via a heat-transfer material. Also, the case is provided with a connector housing for external connection.

For example, FIG. 2 and FIG. 10 of Patent Document 1 specified below show an electronic control unit that includes a case 2 having an opened ceiling surface and storing therein a circuit board 1, a cover 3 covering the case opening and attached to the case 2, a groove portion (seal groove) 22 provided to either one of the case 2 and the cover 3, a protruding portion 31 provided to the other one of the case 2 and the cover 3 and inserted into the groove portion 22. The cover 3 is attached to the case 2 by inserting the protruding portion 31 into the groove portion 22 via a seal material 30. The both side surfaces of the protruding portion 31 are inclined so that a distance between the side surfaces of the protruding portion 31 and an opposing internal surface of the groove portion 22 increases from top to bottom of the groove portion 22 in a state where the cover 3 is attached to the case 2.

By inclining the side surfaces of the protruding portion 31 inwardly with respect to the internal surface of the groove portion 22 from top to bottom of the groove portion 22, even in a case where a highly viscous adhesive 30 is used as the seal material, it becomes possible to insert the protruding portion 31 into the groove portion 22 by pressing the adhesive 30 with the side surfaces of the protruding portion 31. Hence, a pressure applied to the adhesive 30 can be increased and the adhesive 30 can be spread sufficiently across the side surfaces of the protruding portion 31. Accordingly, because wettability of the adhesive 30 on the side surfaces of the protruding portion 31 is enhanced, an adhesion force is increased. Hence, sealing performance between the case 2 and the cover 3 can be enhanced. In addition, storing portions 26 that store the seal material 30 overflown from the seal groove 22 are provided between a fixing portion 20 and the seal groove 22 of the case 2.

Also, FIG. 1 and FIG. 2 of Patent Document 2 specified below show a bonding structure of a resin case. According to this bonding structure, a convex portion (protruding strip) 7 provided to a member 3 as one of subjects to be bonded and a resin adhesive 5 are placed in a concave portion (groove) 6 provided to a member 2 as the other one of the subjects to be bonded so that the both members 2 and 3 are bonded to each other by allowing the resin adhesive 5 to set. An interval between a side wall 6a of the concave portion 6 and a side wall 7a of the convex portion 7 is set larger in an opening of the concave portion 6 than in an internal portion of the concave portion 6 and the concave portion 6 is provided with a guide portion that guides the convex portion 7 to a predetermined position in the concave portion 6. By setting the interval between the side wall 6a of the concave portion 6 and the side wall 7a of the convex portion 7 larger in the opening of the concave portion 6 than in the internal portion of the concave portion 6, it becomes possible to obtain a satisfactory bonding state by preventing the resin adhesive 5 from being forced out of the concave portion 6 by a capillary phenomenon. Further, it becomes possible to prevent positional displacement between the convex portion 7 and the concave portion 6 in a reliable manner and adverse influences of the capillary phenomenon can be reduced further. In addition, FIG. 7 of Patent Document 2 shows that a step-like adhesive inflow chamber 16 is provided in the opening of the concave portion 6 to prevent the resin adhesive 5 from being forced out from the opening.

Patent Document 1: Japanese Patent No. 4892527 (paragraphs 0032 to 0035, FIG. 2 and FIG. 10)
Patent Document 2: Japanese Patent No. 3355761 (paragraphs 0016, 0017, 0030, and 0031, FIG. 1, FIG. 2, and FIG. 7)

According to the technique of Patent Document 1, the ring-like protruding strip (protruding portion) 31 provided along an outer circumferential portion of the cover 3 is fit into the seal groove 22 provided along an outline outer circumference of the case 2 and a fit-in clearance is tapered so that the fit clearance becomes wide at the bottom of the groove and narrow in the opening of the seal groove 22. However, by taking a variance of dimensions of the respective portions into account, even when positioning pieces 20a and 20b for the cover 3 are provided, it is difficult to reduce a clearance between the seal groove 22 and the base of the ring-like protruding strip 31 to zero in the opening of the seal groove 22 and it is necessary to secure a minimum clearance in consideration of dimensional accuracy of the respective portions. A relative fluctuation rate of a variance of the clearance dimension with respect to a groove width becomes a problem particularly with a large case having a long opposite side distance. When the clearance dimension becomes zero, a thickness of the seal material 30 is reduced to zero partially. This poses a problem that not only waterproof performance is deteriorated, but also an outer shape dimension of the case 2 is increased because of a need to increase a size of the storing portions 26 used to store a surplus of the seal material 30 flowing out to the external surface of the case 2. In addition, fixing screws 28 fixing the case 2 and the cover 3 are provided at positions on an outer side of the seal groove 22. Hence, water does not penetrate into the case 2 where fastened by the fixing screws 28. However, in a case where the cover 3 is made of inexpensive sheet metal, there may be a problem that it becomes difficult to provide a fastening plane portion on the outer side of the protruding portion 31.

According to the technique of Patent Document 2, there is a tapered portion where a width of the opening of the seal groove 6 widens from bottom to top (the tapering direction is opposite to the tapering direction in Patent Document 1) and the protruding strip (convex portion) 7 fit into the seal groove (concave portion) 6 is guided to a fit-in position at a center of the seal groove 6. However, by taking variances of dimensions of the respective portions into account, even when the protruding strip 7 is guided to the fit-in position by the tapered portion, it is difficult to reduce a clearance between the tip end of the protruding strip 7 and the back end of the seal groove 6 to zero. Accordingly, it is necessary to secure a minimum clearance in consideration of dimensional accuracy of the respective portions. A relative fluctuation rate of a variance of the clearance dimension with respect to the groove width becomes a problem particularly with a large case having a long opposite side distance. When the clearance dimension becomes zero, a thickness of the seal material (adhesive) 5 is reduced to zero partially. This poses a problem that not only waterproof performance is deteriorated, but also an outer shape dimension of the case is increased because of a need to increase a size of the inflow chamber 16 used to store a surplus of the seal material 5 flowing out to the external surface of the case.

SUMMARY OF THE INVENTION

The invention is devised to solve the problems in the related art discussed above and has a first object to provide a casing that can be sealed hermetically with a seal material by securing a seal clearance in a reliable manner even when dimensions of respective portions vary and thereby achieves enhanced waterproof performance against penetration of water into a case.

Also, the invention has a second object to provide an assembling method of a casing that makes it possible to assemble a casing homogeneously by preventing a seal material from overflowing from an outer circumferential groove to an outside in a visually unpleasant manner during assembly and eliminates a need to hide the flown out seal material.

A casing according to an aspect of the invention includes a case and a cover each of which is of substantially a rectangular shape having at least two pairs of opposite sides and provided with a hermetically sealing portion using a seal material in a fit portion along outer circumference portions of both of the case and the cover to hermetically store a circuit board on which circuit components are mounted. The hermetically sealing portion is formed of: an outer circumferential groove provided along the fit portion of the case and an opposing surface portion opposing the cover and formed to continue from an upper edge portion of an inner-side internal wall of the outer circumferential groove in an inward direction of the casing; a planar tray portion provided along the fit portion of the cover to extend with a predetermined tray clearance G2 between the tray portion and the opposing surface portion and an outer circumferential protruding portion formed by bending to go into the outer circumferential groove in a loose-fit state from an outer-side end portion of the tray portion; and the seal material filled in a portion from the outer circumferential groove to the tray clearance G2. Herein, let W be a groove width of the outer circumferential groove, B be a thickness of the outer circumferential protruding portion, A be an outer clearance that is a clearance between an outer-side internal wall surface of the outer circumferential groove and an external wall surface of the outer circumferential protruding portion, C be an inner clearance that is a clearance between an inner-side internal wall surface of the outer circumferential groove and an internal wall surface of the outer circumferential protruding portion, then the groove width W is expressed as:

width groove W=outer clearance A+thickness B+inner clearance C. Also, let A0 be the outer clearance and C0 be the inner clearance when center positions of the case and the cover coincide with each other, then master dimensions of respective portions are set to satisfy a relation expressed as: A0>C0, without fail even when dimensions of the respective portions vary. In a case where the center positions of the case and the cover are biased and the inner clearance at a given position in a circumferential direction of the hermetically sealing portion is given as C=0 and the outer clearance at this point is given as A=A0+C0, the inner clearance at a position on an opposite side to the firstly-mention position in the circumferential direction is given as C=2×C0 and the outer clearance is given as A=A0−C0. Hence, a fluctuation range of the outer clearance A caused by a variance of an attachment position of the cover is given as A=A0±C0, so that A>0 is always ensured for the outer clearance A.

An assembling method of a casing according to another aspect of the invention is an assembling method of the casing described above configured in such a manner that: the case is formed of a heat-conducting member provided with integrally-molded heat-releasing fins; the case is one of a a case to which a connector housing molded from resin is integrally attached and a resin molded article provided with an integrally-molded connector housing; the heat-releasing fins formed of the heat-conducting member are provided in one of a manner that the heat-releasing fins are integrally molded with the case and a manner that the heat-releasing fins are integrally attached to the case; and a height H of an outer circumferential wall of the outer circumferential groove provided to the case is higher than an external surface position of the tray portion provided to the cover and a fixing portion of the circuit board installed to the case is provided at a position protruding step-wise and higher than the opposing surface portion opposing the tray portion. According to the assembling method, steps as follows are sequentially performed: a connection pin press-fitting step of press-fitting a connection pin into the connector housing; a heat-conducting material applying step of applying a heat conducting material on internal surfaces of the heat-releasing fins forming a part of the case in a surface opposing a heat-generating component that is a part of the circuit components mounted on the circuit board; a circuit board attaching step of attaching and fixing the circuit board on which are mounted the circuit components to an opening internal surface of the case; a connection pin soldering step of connecting the connection pin to the circuit board by soldering; and a seal material filling step of filling the outer circumferential groove of the case with a waterproof seal material. Thereafter, the cover is attached and fixed to the case in a cover attaching step. Herein, a filling amount of the seal material is managed so that the seal material pushed out from the outer clearance A that is a clearance between the outer-side internal wall surface of the outer circumferential groove and the external wall surface of the outer circumferential protruding portion provided to the cover does not overflow from the external wall of the case having the external wall height H.

According to the casing configured as above, the outer circumference groove to be filled with a waterproof seal material is provided to the fit portion of the case in which the circuit board is stored, and the circuit board is hermetically sealed by the cover having the outer circumferential protruding portion fit into the outer circumferential groove. Let A0 be the outer clearance between the outer-side internal wall surface of the outer circumferential groove and the external wall surface of the outer circumferential protruding portion and C0 be the inner clearance between the inner-side internal wall surface of the outer circumferential groove and the internal wall surface of the outer circumferential protruding portion when the center positions of the case and the cover coincide with each other, master dimensions of the respective portions are set so as to satisfy a relation expressed as: A0>C0.

Hence, a fluctuation range of the outer clearance caused by a variance fluctuation of an attachment position of the cover is given as A=A0±C0, so that A>0 is always ensured. Accordingly, because it becomes possible to prevent penetration of water from the external surface of the cover into the outer circumferential groove, a need to manage assembling accuracy for a fixing position of the cover is eliminated. Hence, there can be achieved an advantage that an inexpensive and high-quality board storing casing can be obtained.

Also, because the outer clearance is secured, waterproof seal performance is ensured without having to provide the cover with an extended plane portion opposing the external wall end face of the outer circumferential groove of the case as in the related art. Hence, there can be achieved an advantage that the casing can be more compact by reducing a thickness of the external wall of the outer circumferential groove.

The assembling method of the casing configured as above includes the connection pin press-fitting step, the heat-conducting material applying step, the circuit board attaching step, the connection pin soldering step, the seal material filling step, and the cover attaching step. The circuit board and the connector housing are put together into a single piece using a case that is either a heat-conductive member or a resin molded article as a medium. Heat generated in the heating components is transmitted to the heat-releasing fins provided integrally with the case by bypassing the circuit board and diffused from the heat-releasing fins. Hence, even when there is a variance fluctuation of the attachment position of the cover, the casing can be assembled according to a procedure that does not give any influence on a relative position of the circuit board with respect to the connection pin and a relative position of the heating components with respect to the heat-releasing fins.

Accordingly, because the case is molded, it becomes possible to obtain a dimensional relation of the outer circumferential groove of the case and the outer circumferential protruding portion of the cover with accuracy. Hence, there can be achieved an advantage that waterproof seal performance between the cover and the case can be enhanced against a variance fluctuation of the attachment position of the cover.

In addition, by making the external wall of the outer circumferential groove sufficiently high, the seal material overflown from the outer clearance does not flow out to the outside of the case and the outward appearance does not become visually unpleasant. Rather, the flown-out seal material adheres to the external wall of the tray portion of the cover without a need to hide the adhering seal material. Hence, there can be achieved an advantage that it becomes possible to evaluate stability of the quality as a finished product by checking a seal material adhering area by a visual inspection or an image diagnosis.

In particular, it is impossible to make a determination as to whether the seal material filled in the outer clearance A between the outer circumferential groove and the outer circumferential protruding portion is perfectly filled on the entire circumference by a visual inspection or an image diagnosis unless A>0 is satisfied always for the outer clearance A. Therefore, the dimensional relation that the outer clearance is secured in a reliable manner is a crucial structural requirement.

The foregoing and other objects features, aspects, and advantages of the present invention will become more apparent from the following detailed description of the present invention when taken in conjunction with the accompanying drawings.

BRIEF DESCRIPTION OF THE DRAWINGS

FIG. 9 is a flowchart depicting an assembling procedure by an assembling method of the casing according to the second embodiment of the invention.

DETAILED DESCRIPTION OF THE PREFERRED EMBODIMENTS

First Embodiment

Figure 1:
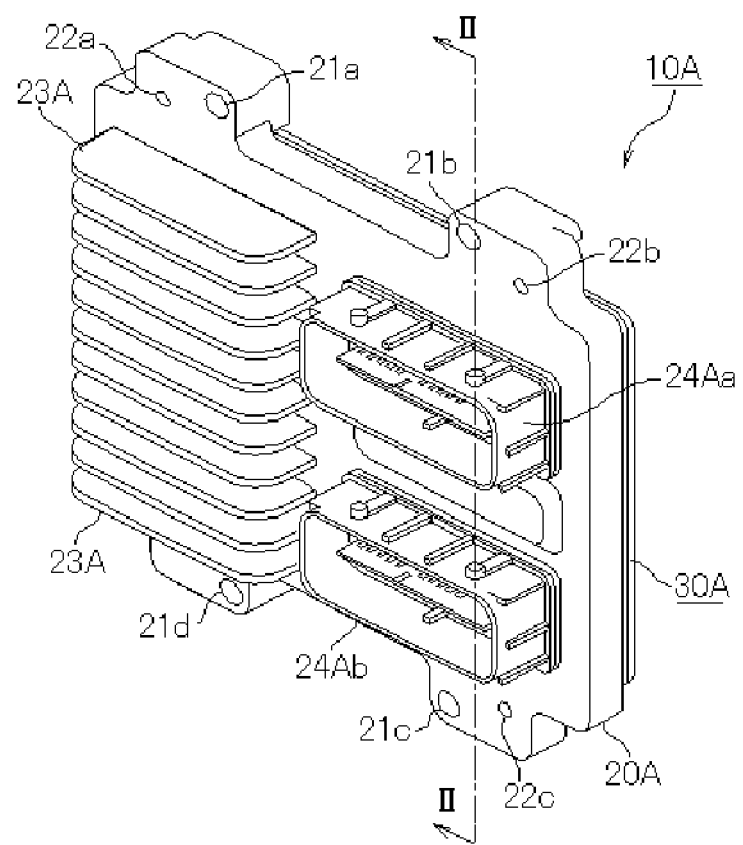
FIG. 1 is a perspective view showing an outward appearance of a casing according to a first embodiment of the invention when employed for an in-vehicle electronic control unit.
Figure 2:
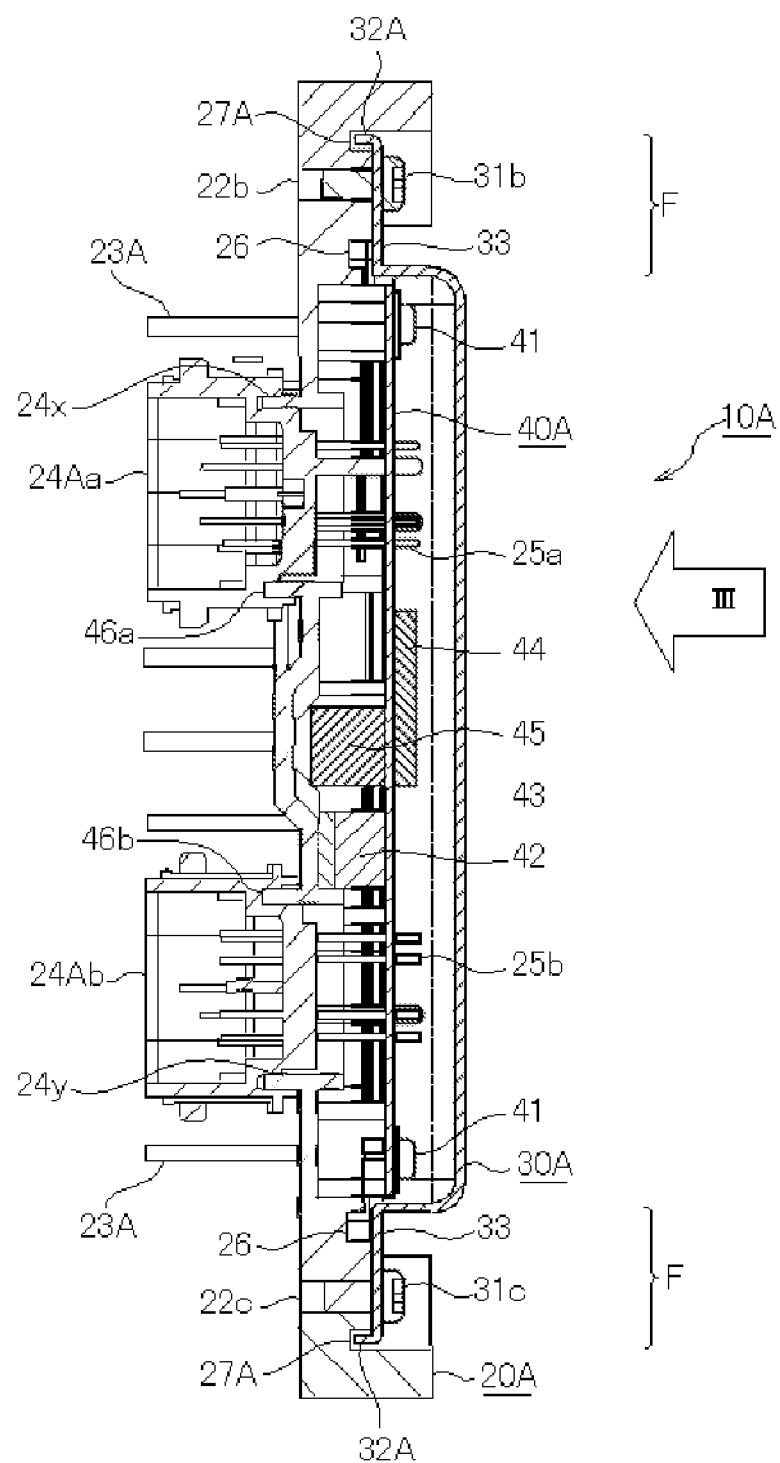
FIG. 2 is a cross section taken on the line II-II and viewed in a direction indicated by arrows of FIG. 1.
Figure 3:
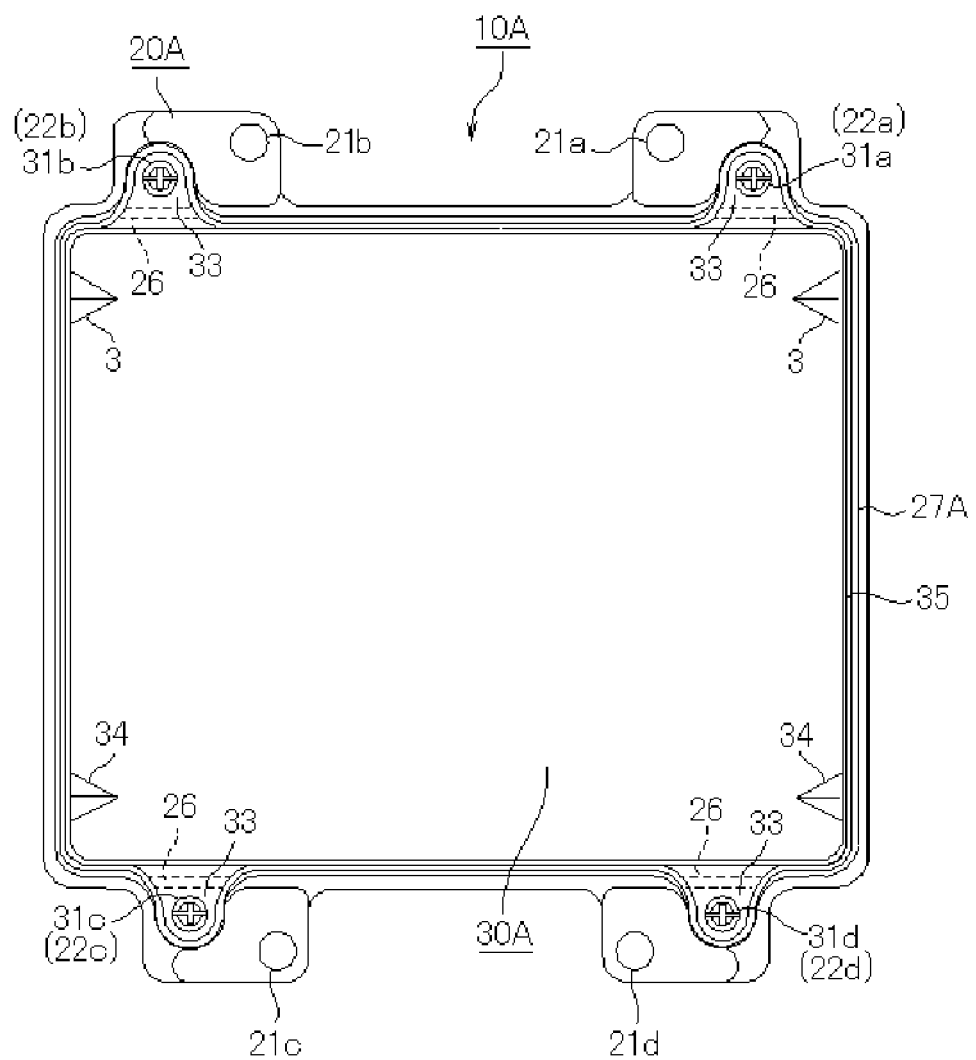
FIG. 3 is a rear view when viewed in a direction indicated by an arrow III of FIG. 2.
Figure 4:
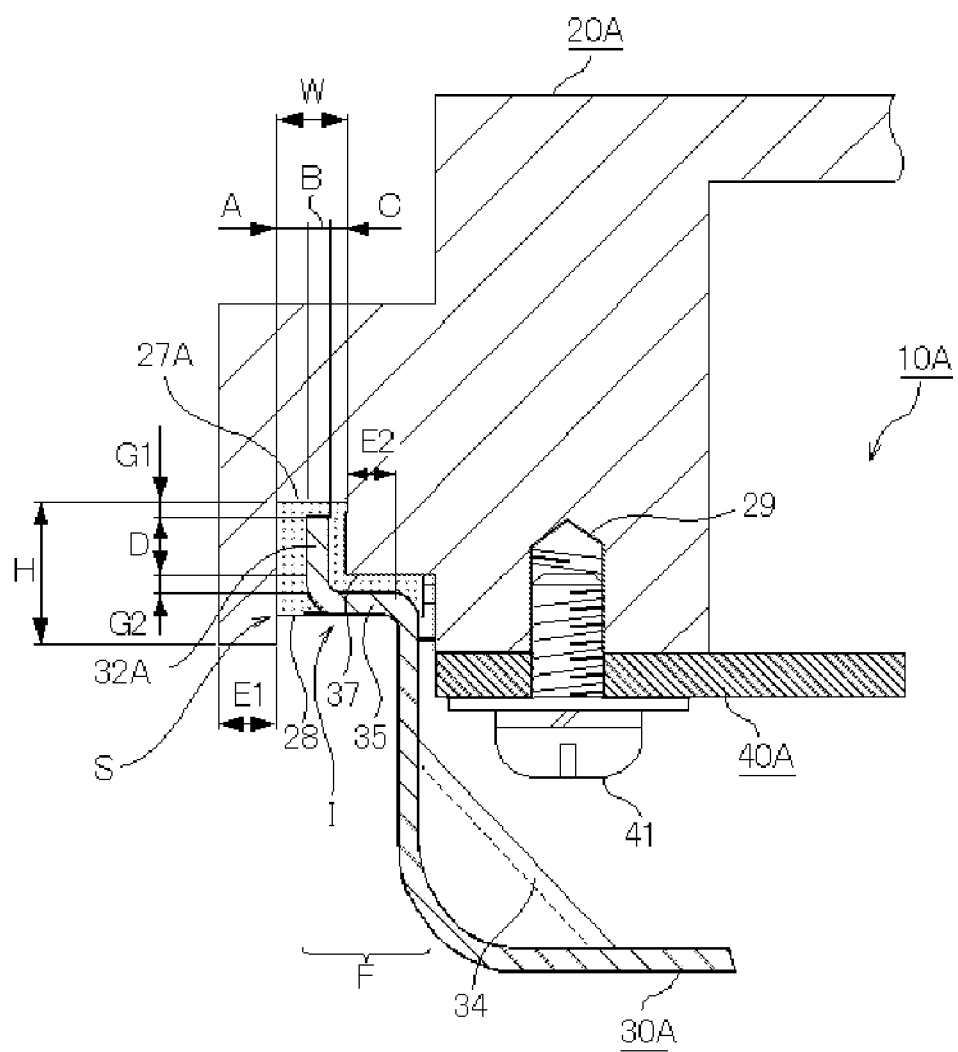
FIG. 4 is an enlarged cross section showing a hermetically sealing portion provided to a fit portion along outer circumference portions of both of a case and a cover of the casing shown in FIG. 1 and a vicinity thereof.

Hereinafter, a casing according to a first embodiment of the invention when employed for an in-vehicle electronic control unit will be described with reference to FIG. 1 through FIG. 4. FIG. 1 is a perspective view showing an outward appearance of the casing according to the first embodiment of the invention when employed for an in-vehicle electronic control unit. FIG. 2 is a cross section taken on the line II-II and viewed in a direction indicated by arrows of FIG. 1. FIG. 3 is a rear view when viewed in a direction III indicated by an arrow of FIG. 2. FIG. 4 is an enlarged cross section showing a hermitically sealing portion provided to a fit portion along circumferential portions of both of a case and a cover of the casing shown in FIG. 1 and a vicinity thereof. Same reference numerals denote same portions in the respective drawings.

Referring to FIG. 1 first, a casing 10A in which to store a board is formed of a case 20A made, for example, of die-cast aluminum that is a heat-conducting member and a cover 30A made of sheet metal and firmly screwed to a rear surface of the case 20A. A circuit board 40A described below with reference to FIG. 2 is mounted inside the case 20A and hermetically sealed in an internal space of the casing 10A by a hermetically sealing portion S (shown in FIG. 4) provided to a fit portion F (shown in FIG. 2 and FIG. 4) of the case 20A and the cover 30A.

Attachment legs are provided to protrude in four corners of the case 20A. The casing 10A is firmly screwed to an unillustrated attachment surface via attachment holes 21a through 21d provided to the respective attachment legs. The attachment legs of the case 20A are provided with screw holes 22a through 22d (22d is not shown) in the vicinity of the attachment holes 21a through 21d, respectively. Fixing screws 31a through 31d of the cover 30A described below with reference to FIG. 2 and FIG. 3 are threaded into the screw holes 22a through 22d, respectively, from the rear surface side of FIG. 1. A plurality of heat-releasing fins 23A are integrally molded with the case 20A and connector housings 24Aa and 24Ab, which are resin molded articles, are exposed from a ceiling surface. These configurations will be described in detail below with reference to FIG. 2.

Referring to FIG. 2 showing a state in which the circuit board 40A is attached to the case 20A, the circuit board 40A fixed to an internal surface of the case 20A with a plurality of board fixing screws 41 includes circuit components, such heating components 42, electronic components 44, and tall components 45, mounted on the both surfaces. Also, a soft heat-conducting material 43 is applied to a space between the heating components 42 and an internal wall of the case 20A. The tall components 45, such as a capacitor and an electromagnetic component, are disposed in a portion positioned at a midpoint between a pair of the connector housings 24Aa and 24Ab where the ceiling surface of the case 20A is high. Other circuit components, that is, the electronic components 44, such as surface-mounted components, are disposed at many points on the both surfaces of the circuit board 40A.

A pair of the connector housing 24Aa and 24Ab is provided with ring-like concave portions 24x and 24y, respectively. Ring-like walls 46a and 46b provided to the ceiling surface of the case 20A are fit in the ring-like concave portions 24x and 24y, respectively, and fixed by bonding via an unillustrated seal material. A pair of the connector housings 24Aa and 24Ab is provided with connection pins 25a and 25b, respectively, which are press-fit in the connector housings 24Aa and 24Ab, respectively, before or after a step of attaching the connector housings 24Aa and 24Ab to the case 20A. The connection pins 25a and 25b penetrate through plated through-holes (not shown) provided to the circuit board 40A and protrude from the rear surface, so that the connection pins 25a and 25b are connected to the circuit board 40A by soldering using a jet-stream soldering device.

The cover 30A is fixed to the fit portion in the opening surface of the case 20A as the fixing screws 31a through 31d (31a and 31d are not shown) are inserted into the screw holes 22a through 22d (22a and 22d are not shown) of the case 20A, respectively. An outer circumferential protruding portion 32A is provided along the outer circumference of the cover 30A and an outer circumferential groove 27A to be filled with a seal material 28 described below with reference to FIG. 4 is provided along the outer circumference of the case 20A. The outer circumferential protruding portion 32A is inserted in the outer circumferential groove 27A in a loose-fit state with a predetermined clearance in between.

Now referring to FIG. 3 showing a rear view of the casing 10A, the outer circumferential groove 27A provided to the case 20A is a ring-like groove so as to circulate the fit portion F formed along the outer circumferential portion of the case 20A. The screw holes 22a through 22d (see FIG. 1 and FIG. 2), in which the fixing screws 31a through 31d used to firmly fasten the cover 30A are threaded, respectively, are provided in an internal region of the outer circumferential groove 27A. The outer circumference groove 27A is formed to take a detour on the outer side of the screw holes 22a through 22d. Meanwhile, an inner groove 26 is provided on the inner side of the screw holes 22a through 22d to bypass the detoured portion of the outer circumferential groove 27A. Hence, the outer circumferential groove 27A and the inner groove 26 together surround a periphery of the screw holes 22a through 22d.

The outer circumferential groove 27A and the inner groove 26 are filled with the seal material 28 described below. The seal material 28 filled in the inner groove 26 abuts on internal surfaces of flat portions 33 that are regions obtained by outwardly expanding a tray portion 35 at points corresponding to the screw holes 22a through 22d of the cover 30A. Hence, should water penetrate inside from head portions of the fixing screws 31a through 31d, the inner groove 26 prevents water from penetrating into the case 20A. It should be noted that the outer circumferential protruding portion 32A is also formed to take a detour on the outer side of the screw holes 22a through 22d in a corresponding manner to the detoured portion of the outer circumferential groove 27A. Also, stopper portions 34 of a canopy shape when viewed from the inside obtained by inwardly recessing predetermined portions of a cover main body and described below with reference to FIG. 4 are provided in four corners of the cover 30A. Hence, should the board fixing screws 41 (see FIG. 2 and FIG. 4) fixing the circuit board 40A be loosened, the screw heads of the board fixing screws 41 interfere with the stopper portions 34 and the board fixing screws 41 are prevented from falling off into the casing 10A.

Referring to FIG. 4 showing an enlarged view of a waterproof seal portion between the case 20A and the cover 30A, screw holes 29 are provided on a step portion forming the opening surface provided on the inner side of the fit portion F of the case 20A. The case 20A and the circuit board 40A are put together into a single piece by inserting the board fixing screws 41 used to fix the circuit board 40A into the screw holes 29. The outer circumferential protruding portion 32A of the cover 30A is inserted in a loose-fit state into the outer circumferential groove 27A of the case 20A filled with the seal material 28. The cover 30A is provided with the tray portion 35 of a ring or flange shape forming an opening end face of the cover 30A. The outer circumferential protruding portion 32A is formed by drawing to stand upright at an outer circumferential position of the tray portion 35. It should be noted that FIG. 4 shows the casing 10A upside down from an orientation during assembly. Also, the flat portions 33 are formed in the same plane like an extension of the tray portion 35.

Herein, let W be a groove width of the outer circumferential groove 27A, B be a thickness of the outer circumferential protruding portion 32A, A be an outer clearance that is a clearance between an outer-side internal wall surface of the outer circumferential groove 27A and an external wall surface of the outer circumferential protruding portion 32A, and C be an inner clearance that is a clearance between an inner-side internal wall surface of the outer circumferential groove 27A and an internal wall surface of the outer circumferential protruding portion 32A. Then, an equation as follows is obtained:

$$\text{groove width } W = \text{outer clearance } A + \text{thickness } B + \text{inner clearance } C.$$

Also, let A0 be the outer clearance and C0 be the inner clearance when center positions of the case 20A and the cover 30A coincide with each other, then master dimensions of the respective portions are set to satisfy a relation expressed as: A0>C0, without fail even when the dimensions of the respective portions vary. Hence, in a case where the center positions of the case 20A and the cover 30A are biased and the inner clearance at one of a pair of the opposite side positions is given as C=0 and the outer clearance is given as A=A0+C0, the inner clearance at the other opposite side position is given as C=2×C0 and the outer clearance is given as A=A0−C0. Hence, a fluctuation range of the outer clearance caused by a variance fluctuation of the attachment position of the cover 30A is given as A=A0±C0. Hence, A>0 is always ensured for the outer clearance A.

A predetermined tip clearance G1 is provided between a tip end surface of the outer circumferential protruding portion 32A of the cover 30A and a bottom surface of the outer circumferential groove 27A of the case 20A. Also, an opposing surface portion 37 of the cover 20A opposes the internal wall of the tray portion 35 with a predetermined tray clearance G2 in between. A value of the tip clearance G1 and a value of the tray clearance G2 when the cover thickness is B satisfy a relation expressed as: G1/B>G2/E, where E2 is a tray length that is a length of an overlapping portion of the tray portion 35 and the case 20A. Also, the tray length E2 is a dimension larger than E1 given as an external wall thickness of the outer circumferential groove 27A of the case 20A. The external wall thickness E1 of the outer circumferential groove 27A is a dimension smaller than the groove width W of the outer circumferential groove 27A. A overlapping depth D of the outer circumferential protruding portion 32A of the cover 30A and the outer circumferential groove 27A is a dimension equal to or larger than the groove width W of the outer circumferential groove 27A. Further, a height H of the external wall forming the outer circumferential groove 27A of the case 20A is larger than a height of the external wall of the tray portion 35 of the cover 30A. Hence, the seal material 28 pushed out from the outer clearance A does not overflow by surmounting the external wall of the case 20A having the external wall height H.

In the description above, the connector housing 24Aa and 24Ab protrude from the ceiling surface of the case 20A and straight pins orthogonal to the circuit board 40A are used as the connection pins 25a and 25b. It should be appreciated, however, that the connector housings may protrude from a side of the case and right-angle connection pins having a portion orthogonal to the circuit board and a portion parallel to the circuit board may be used as the connection pins. Also, referring to FIG. 3, in a case where it is desirable to efficiently use a space between an upper pair of the attachment legs having the attachment holes 21a and 21b and a space between a lower pair of the attachment legs having the attachment holes 21d and 21c, as will be described below with reference to FIG. 7, the outer circumferential groove of the case and the outer circumferential protruding portion of the cover inserted therein may be formed so as to circulate along the outer circumference of a case portion expanded to take a detour around the attachment holes 21a through 21d. In this case, the casing 10A takes a shape further closer to a rectangular shape and the attachment holes 21a through 21d cut into the casing of a rectangular shape. It thus becomes possible to dispose an expanded portion of the circuit board to the expanded case portion.

Figure 5:
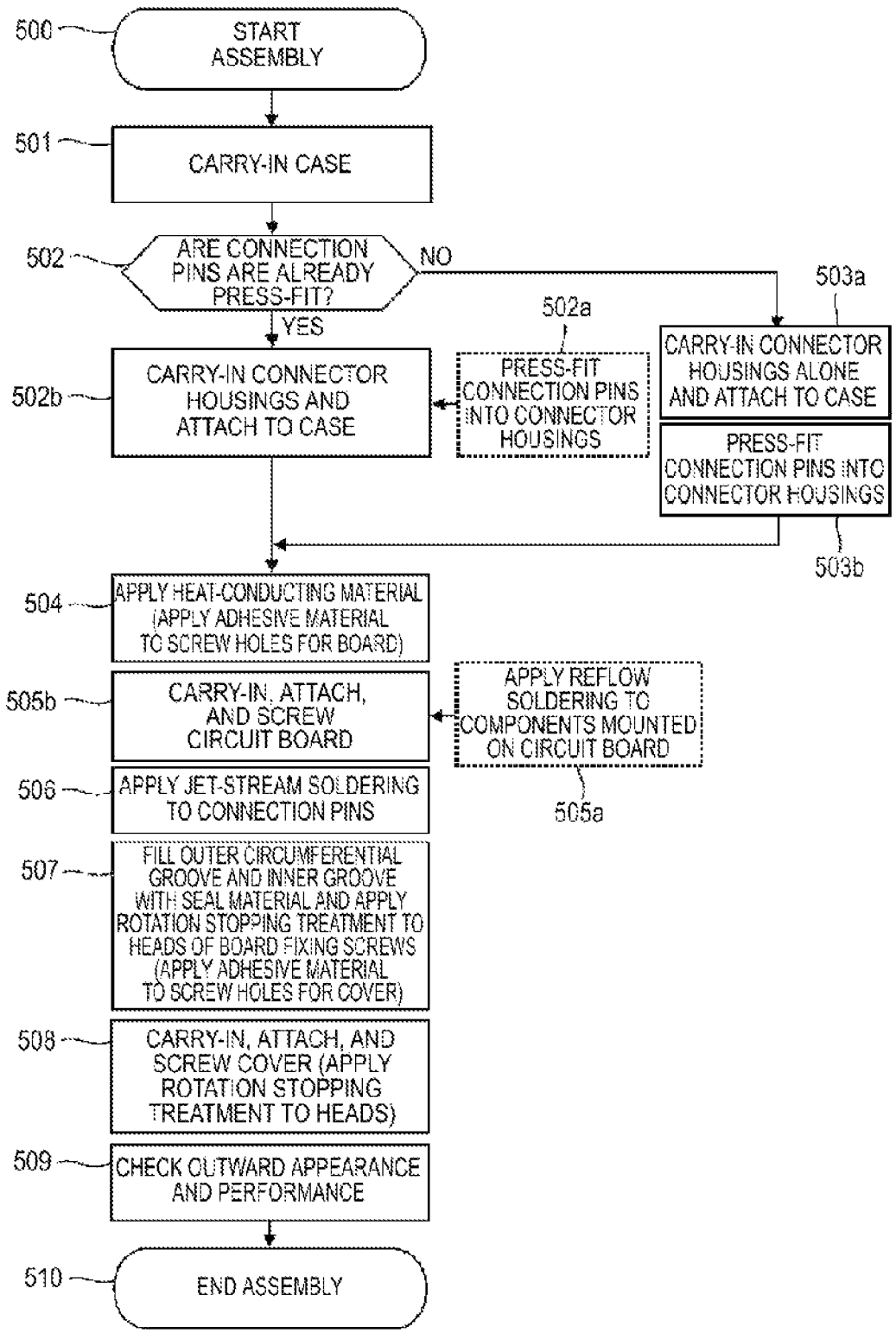
FIG. 5 is a flowchart depicting an assembling procedure by an assembling method of the casing according to the first embodiment of the invention.

An assembling method of the casing according to the first embodiment of the invention will now be described in detail according to the flowchart shown in FIG. 5. Referring to FIG. 5, Step 500 is an assembly starting step of the casing 10A shown in FIG. 1 through FIG. 4 and following Step 501 is a step in which the case 20A is carried-in to an assembly line. Following Step 502 is a determination step in which subsequent processing differs depending on whether the connection pins 25a and 25b are preliminarily press-fit into the connector housing 24Aa and 24Ab, respectively, in a different step. If the connection pins 25a and 25b are already press-fit, a determination of YES is made and the flow proceeds to Step 502b. If the connection pins 25a and 25b are not press-fit yet, a determination of NO is made and the flow proceeds to Step 503a.

Step 502b is a step in which the connector housings 24Aa and 24Ab in which the connection pins 25a and 25b are press-fit, respectively, in different Step 502a as described above are attached to the case 20A. To attach the connector housings 24Aa and 24Ab to the case 20A, an unillustrated waterproof seal material is applied to the ring-like grooves 24x and 24y of the connector housings 24Aa and 24Ab, respectively, and then the ring-like walls 46a and 46b provided to the ceiling surface of the case 20A are fit into the ring-like grooves 24x and 24y, respectively.

Step 503a is a step in which the connector housings 24Aa and 24Ab in which the connection pins 25a and 25b are not press-fit yet, respectively, are attached to the case 20A in the same manner as in Step 502b. Following Step 503b is a step in which the connection pins 25a and 25b are press-fit, respectively, in the connector housings 24Aa and 24Ab already attached to the case 20A. It is preferable to perform a press-fitting work of the connection pins 25a and 25b immediately before Step 506 described below in terms of rust prevention. Step 504 following Step 502b or Step 503b is a step in which the heat-conducting material 43, which is a soft heat-conducting material, is applied on the internal surface of the case 20A at positions opposing the heating components 42.

In a case where, for example, a thermosetting adhesive material that exerts a bonding ability in the absence of oxygen is used as a rotation stopper of the board fixing screws 41, it is recommended to apply a rotation stopping adhesive material to the screw holes 29 (see FIG. 4) provided to the case 20A to firmly screw the circuit board 40A in Step 504. Following Step 505b is a step in which the circuit board 40A on which the circuit components 42, 44, and 45 are already mounted by soldering in different Step 505a is carried-in and the circuit board 40A is fixed to the case 20A by fastening the board fixing screws 41 (see FIG. 2 and FIG. 4) in the screw holes 29. Following Step 506 is a step in which soldering is applied to the connection pins 25a and 25b penetrating through the plated through-holes (not shown) of the circuit board 40A.

Following Step 507 is a step in which the outer circumferential groove 27A and the inner groove 26 of the case 20A are filled with the waterproof seal material 28 and also a rotation stopping adhesive material is applied to a periphery of the heads of the board fixing screws 41. A filling amount of the seal material 28 is a necessary and sufficient amount and adjusted and managed to an an appropriate value so that the seal material 28 does not overflow from the outer circumferential groove 27A to the outside by surmounting the outer circumferential wall when the case 20A and the cover 30A are put together into a single piece in Step 508 described below. The waterproof seal material 28 may be used intact as the rotation stopper of the board fixing screws 41.

Following Step 508 is a step in which the cover 30A prepared by press working in a different step is carried-in and firmly attached to the case 20A by threading the fixing screws 31a through 31d into the screw holes 22a through 22d, respectively. In a case where both of the cover 30A and the case 20A are made of a metal material, it is not necessary to apply rotation stopping treatment to the fixing screws 31a through 31d used to put the former and the latter together into a single piece. However, in a case where the case 20A is thin and it is desirable to apply rotation stopping treatment just in case, either an adhesive material is applied to the screw holes 22a through 22d in Step 507 or an adhesive material is applied to the periphery of the heads of the fixing screws 31a through 31d after these screws are fastened in Step 508.

Following Step 509 is a step in which an outward appearance and electric performance of the casing 10A are checked to proceed to assembly ending Step 510. In the checking step, it is determined whether the seal material 28 filled in the outer circumferential groove 27A overflows from the outer clearance A in an adequate amount and adheres to the external surface of the tray portion 35 of the cover 30A as is indicated by an arrow I of FIG. 4 by a visual inspection or an image diagnosis using an electronic camera. The respective steps described above correspond to case carrying-in step 501, connection pin press-fitting step 502a or 503b, circuit board attaching step 505b, heat-conducting material applying step 504, connection pin soldering step 506, seal material filling step 507, cover attaching step 508, outward appearance and performance checking step 509.

As has been described, the casing 10A according to the first embodiment of the invention is formed of the case 20A and the cover 30A each of which is of substantially a rectangular shape having at least two pairs of opposite sides and provided with the hermetically sealing portion S using the seal material 28 in the fit portion F along the outer circumference portions of both of the case 20A and the cover 30A to hermetically store the circuit board 40A on which the circuit components 42, 44, and 45 are mounted. Herein, the hermetically sealing portion S is formed of: the outer circumferential groove 27A provided along the fit portion F of the case 20A and the opposing surface portion 37 opposing the cover 30A and formed to continue from the upper edge portion of the inner-side internal wall of the outer circumferential groove 27A in an inward direction of the casing 10A; the planar tray portion 35 provided along the fit portion F of the cover 30A to extend with a predetermined tray clearance G2 between the tray portion 35 and the opposing surface portion 37 and the outer circumferential protruding portion 32A formed by bending to go into the outer circumferential groove 27A in a loose-fit state from the outer-side end portion of the tray portion 35; and the seal material 28 filled in a portion from the outer circumferential groove 27A to the tray clearance G2. Let W be a groove width of the outer circumferential groove 27A, B be a thickness of the outer circumferential protruding portion 32A, A be an outer clearance that is a clearance between the outer-side internal wall surface of the outer circumferential groove 27A and the external wall surface of the outer circumferential protruding portion 32A, C be an inner clearance that is a clearance between the inner-side internal wall surface of the outer circumferential groove 27A and the internal wall surface of the outer circumferential protruding portion 32A, then the groove width W is expressed as:

width groove W=outer clearance A+thickness B+inner clearance C. Also, let A0 be the outer clearance and C0 be the inner clearance when center positions of the case 20A and the cover 30A coincide with each other, then master dimensions of respective portions are set to satisfy a relation expressed as: A0>C0, without fail even when dimensions of the respective portions vary. In a case where the center positions of the case 20A and the cover 30A are biased and the inner clearance at a given position in a circumferential direction of the hermetically sealing portion S is given as C=0 and the outer clearance at this point is given as A=A0+C0, the inner clearance at a position on an opposite side to the position in the circumferential direction is given as C=2×C0 and the outer clearance is given as A=A0−C0. Accordingly, a fluctuation range of the outer clearance A caused by a variance of an attachment position of the cover 30A is given as A=A0±C0, so that A>0 is always ensured for the outer clearance A.

It is also configured in such a manner that: a predetermined tip clearance G1 is provided between a tip end surface of the outer circumferential protruding portion 32A of the cover 30A and a bottom surface of the outer circumferential groove 27A of the case 20A; and the opposing surface portion 37 of the case 20A opposes an internal wall of the tray portion 35 with the predetermined tray clearance G2 in between, and a value of the tip clearance G1 and a value of the tray clearance G2 when a cover thickness is B are set to satisfy a relation expressed as:

$$G1/B > G2/E2$$

where E2 is a tray length.

As has been described, regarding claim 2 of the invention, a relation of the tip clearance G1 between the end face of the outer circumference protruding portion and the bottom surface of the outer circumference groove and the tray clearance G2 between the outline tray portion orthogonal to the outer circumferential protruding portion and the internal wall of the case is given as:

$$G1/\text{cover thickness } B > G2/\text{tray length } E2.$$

Hence, the seal material between the outer clearance and the inner clearance is allowed to readily flow so that cover moves to make the dimension homogeneous on one hand, and on the other hand, the seal material can be prevented from flowing out from the tray portion into the case.

The same applies to a cover 30B and a case 20B of a second embodiment below.

Also, it is configured in such a manner that: the tray length E2 that is a length of an overlapping portion of the tray portion 35 and the opposing surface portion 37 of the case 20A is a dimension larger than an external wall thickness E1 of the outer circumferential groove 27A of the case 20A; the external wall thickness E1 of the outer circumferential groove 27A is a dimension smaller than the groove width W of the outer circumferential groove 27A; and an overlapping depth D of the outer circumferential protruding portion 32A of the cover 30A and the outer circumferential groove 27A is a dimension equal to or larger than the groove width W of the outer circumferential groove 27A.

As has been described, regarding claim 3 of the invention, the dimensional relations are expressed as: tray length E2>external wall thickness E1, groove width W of the outer circumferential groove>external wall thickness E1, and overlapping depth D≥groove width W of the outer circumferential groove.

Hence, a leakage shortest distance on the waterproof seal surface is secured by the overlapping depth D of the outer circumferential groove and the tray length E2 on the inside. Accordingly, it becomes possible to further reduce an outer shape dimension of the casing by reducing the external wall thickness E1 to the minimum possible extent.

Also, it is configured in such a manner that: the attachment holes 21a through 21d used to fix the casing 10A are provided to attachment legs provided to the outer circumference portion of the case 20A on an outer side of the outer circumferential groove 27A; the screw holes 22a through 22d used to fix the cover 30A to the case 20A are provided in close proximity to the attachment holes 21a through 21d, respectively, on an inner side of the outer circumferential groove 27A and the inner groove 26 bypassing the outer circumferential groove 27A is provided to surround a periphery of the screw holes 22a through 22d; clearance holes in which to insert the fixing screws 31a through 31d are provided to the flat portions 33 that are regions obtained by inwardly expanding a predetermined portion of the tray portion 35; and the flat portions 33 abut on the waterproof seal material 28 filled in the inner groove 26.

As has been described, regarding claim 5 of the invention, the screw holes used to fix the cover to the case are surrounded by the outer circumferential groove and the inner groove of the case. The outer circumferential groove and the inner groove are filled with the waterproof seal material. The seal material applied to the inner groove abuts on the flat portions of the cover.

Hence, because the fixing screws used to fix the cover and the case are not provided on the outer side of the outer circumferential groove of the case, not only does it become easy to provide the outer circumferential protruding portion of the cover, but it also becomes possible to easily avoid penetration of water from the tip ends and heads of the fixing screws by the waterproof seal material filled in the outer circumferential wall and the inner groove.

The same applies to a casing 10B of the second embodiment below.

Also, it is configured in such a manner that: the circuit board 40A is attached and fixed to the case 20A with the board fixing screws 41 and the cover 30A is fixed to the case 20A with the fixing screws 31a through 31d; and the stopper portions 34 provided to the cover 30A oppose the screw heads of the board fixing screws 41 with a clearance in between when the cover 30A is attached to the case 20A so that the board fixing screws 41 are prevented from falling off in case the board fixing screws 41 are loosened.

As has been described, regarding claim 6 of the invention, the stopper portions are provided to the internal surface of the cover to prevent the board fixing screws from falling off.

When the board fixing screws are loosened and fall off into the casing, there is a risk of a serious failure accompanying a short-circuit and burning of the circuit components mounted on the circuit board. However, should the board fixing screws be loosened during use, the stopper portions protruding toward the internal surface of the cover interfere with the board fixing screws and prevent the board fixing screws from falling off. It thus becomes possible to forestall a serious trouble.

The same applies to the circuit board 40B, the cover 30A, and the case 20B of the second embodiment below.

The assembling method of a casing according to the first embodiment of the invention is an assembling method of the casing described above configured in such a manner that: the case 20A is formed of a heat-conducting member provided with integrally-molded heat-releasing fins 23A; the connector housings 24Aa and 24Ab molded from resin are integrally attached to the case 20A; a height H of the outer circumferential wall of the outer circumferential groove 27A provided to the case 20A is higher than the external surface position of the tray portion 35 provided to the cover 30A and a fixing portion of the circuit board 40A installed to the case 20A is provided at a position protruding step-wise and higher than the opposing surface portion 37 opposing the tray portion 35. According to the assembling method, steps as follows are sequentially performed: the connection pin press-fitting step 502a or 503b of press-fitting the connection pins 25a and 25b into the connector housing 24Aa and 24Ab, respectively; the heat-conducting material applying step 504 of applying the heat conducting material 43 on internal surfaces of the heat-releasing fins 23A forming a part of the case 20A in a surface opposing the heat-generating component 42 that is a part of the circuit components 42, 44, and 45 mounted on the circuit board 40A; the circuit board attaching step 505b of attaching and fixing the circuit board 40A on which are mounted the circuit components 42, 44, and 45 to an opening internal surface of the case 20A; the connection pin soldering step 506 of connecting the connection pins 25a and 25b to the circuit board 40A by soldering; and the seal material filling step 507 of filling the outer circumferential groove 27A of the case 20A with the waterproof seal material 28. Thereafter, the cover 30A is attached and fixed to the case 20A in the cover attaching step 508. A filling amount of the seal material 28 is managed so that the seal material 28 pushed out from the outer clearance A that is a clearance between the outer-side internal wall surface of the outer circumferential groove 27A and the external wall surface of the outer circumferential protruding portion 32A provided to the cover 30A does not overflow from the external wall of the case 20A having the external wall height H.

Also, it is configured in such a manner that: in the circuit board attaching step 505b, the circuit board 40A is attached and fixed to the case 20A with the board fixing screws 41; in the seal material filling step 507, the seal material 28 is applied to a periphery of heads of the board fixing screws 41 as a rotation stopping adhesive material; and when the cover 30A is attached in the cover attaching step 508, the stopper portions 34 provided to the cover 30A oppose the heads of the board fixing screws 41 with a clearance in between to prevent the board fixing screws 41 from falling off in case the board fixing screws 41 are loosened.

As has been described, regarding claim 8 of the invention, the circuit board is fixed to the case with the fixing screws and hermetically sealed with the cover after the rotation stopping treatment is applied to the fixing screws.

Hence, because the fixing screws are not exposed, there is no need to apply waterproof treatment to the screwed portion on one hand, but on the other hand, should the board fixing screws be loosened and fall off into the casing, there is a risk of a serious failure accompanying a short-circuit and burning of the circuit components mounted on the circuit board.

However, the rotation stopping treatment can be applied to the fixing screws easily also in the seal material filling step and should the fixing screws be loosened during use, the stopping portions provided to the cover interfere with the fixing screws and prevent the fixing screws from falling off. It thus becomes possible to forestall a serious problem.

The same applies to a fall-off of the board fixing screws of the second embodiment below.

Also, it is configured in such a manner that: the outer circumferential groove 27A provided to the case 20A is provided to a position on an outer side of the screw holes 22a through 22d in which the fixing screws 31a through 31d used to fix the cover 30A are threaded; the inner groove 26 bypassing a detoured portion of the outer circumferential groove 27A is provided to surround the screw holes 22a through 22d; the cover 30A is obtained by pressing a sheet metal material and includes the tray portion 35 orthogonal to the outer circumferential protruding portion 32A and the flat portions 33 provided in regions obtained by expanding a part of the tray portion 35 and provided with clearance holes in which to insert the fixing screws 31a through 31d; in the seal material filling step 507, the outer circumferential groove 27A and the inner groove 26 are filled with the waterproof seal material 28; and when the cover 30A and the case 20A are firmly screwed to each other with the fixing screws 31a through 31d in the cover attaching step 508, the flat portions 33 abut on the waterproof seal material 28 filled in the inner groove 26.

As has been described, regarding claim 9 of the invention, the cover is fixed to the case with the fixing screws. The screw holes provided to the case are surrounded by the outer circumferential groove and the inner groove provided to the case. The seal material filled in the inner groove abuts on the flat portions of the cover.

Hence, because the fixing screws fixing the cover and the case are not provided on the outer side of the outer circumferential groove of the case, not only does it become possible to easily provide the outer circumferential protruding portion of the cover by sheet metal pressing, but it also becomes possible to readily prevent water penetrating from the tip ends and the heads of the fixing screws by filling the inner groove with the seal material same as the waterproof seal material to be filled in the outer circumferential groove at the same time when the outer circumferential groove is filled with the waterproof seal material.

The same applies to waterproof treatment to the fixing screws in the second embodiment below.

Second Embodiment

Figure 6:
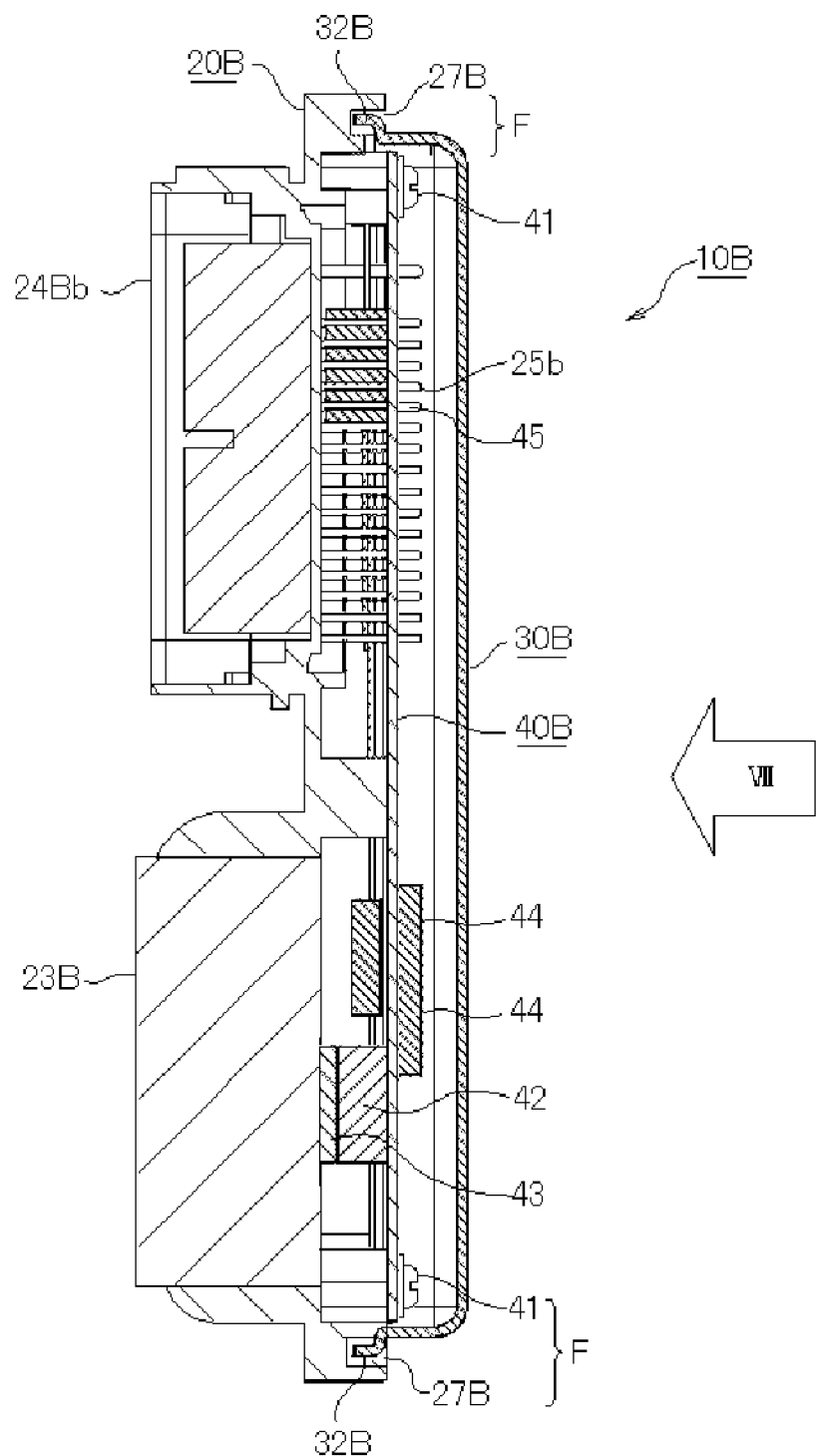
FIG. 6 is a cross section of a casing according to a second embodiment of the invention.
Figure 7:
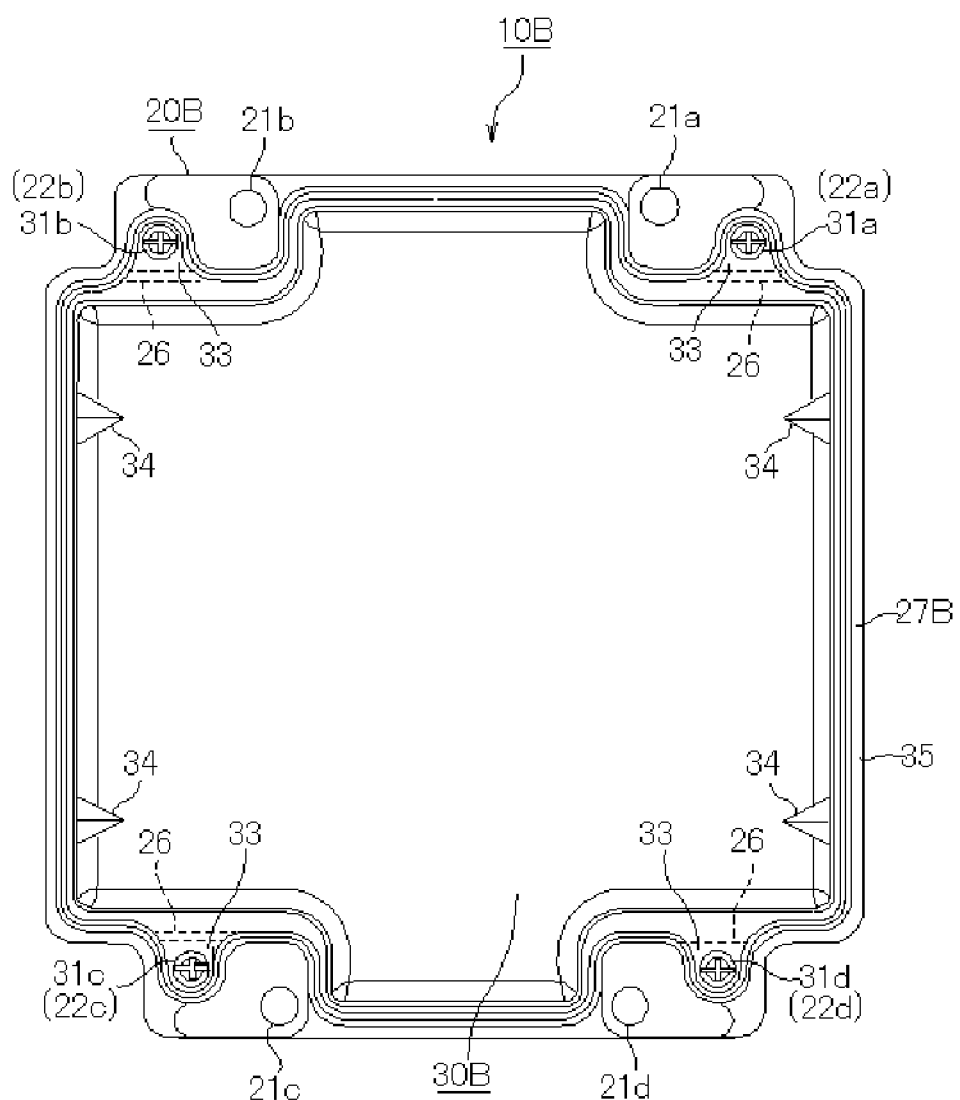
FIG. 7 is a rear view when viewed in a direction indicated by an arrow VII of FIG. 6.
Figure 8:
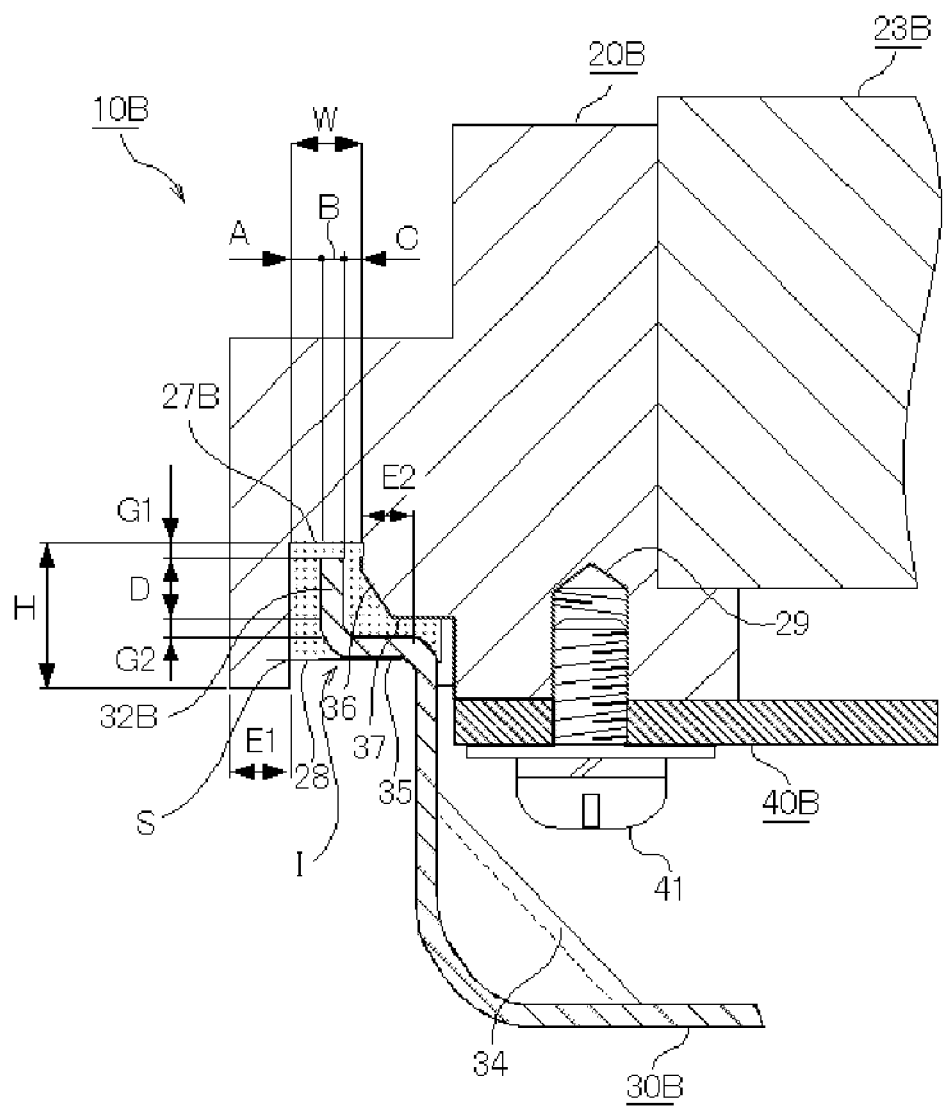
FIG. 8 is an enlarged cross section of a hermetically sealing portion provided to a fit portion along outer circumference portions of both of a case and a cover of the casing shown in FIG. 6.

Hereinafter, a casing according to a second embodiment of the invention will be described with reference to FIG. 6 through FIG. 8. FIG. 6 is a cross section of the casing according to the second embodiment of the invention. FIG. 7 is a rear view when viewed in a direction indicated by an arrow VII of FIG. 6. FIG. 8 is an enlarged cross section of a hermetically sealing portion provided to a fit portion along outer circumferential portions of both of a case and a cover of the casing shown in FIG. 6 and a vicinity thereof. Herein, a difference from the counterpart of FIG. 1 will be chiefly described. Also, members corresponding to the members of the first embodiment above are distinguished by adding a capital B at the end of reference numeral instead of a capital A (a capital A is used in the first embodiment above and a capital B is used in the second embodiment). Referring to FIG. 6 and FIG. 7 first, a casing 10B is formed of a case 20B that is a resin molded article and a cover 30B made of a sheet metal and hermetically closing a circuit board 40B fixed in an inner portion of an opening surface of a fit portion F of the case 20B.

The resin case 20B is provided with a pair of connector housings 24Ba and 24Bb (24Ba is not shown) that are integrally molded with the resin case 20B and aligned side by side in a direction from a front side to a back side of the sheet. Also, a plurality of heat-conducting heat-releasing fins 23B are attached integrally to the resin case 20B or integrally molded with the resin case 20B. As is shown in FIG. 7, attachment legs are provided in four corners of the case 20B. The casing 10B is firmly screwed to an unillustrated attachment surface via attachment holes 21a through 21d provided to the respective attachment legs on the outer side of an outer circumferential groove 27B. Also, unillustrated screw holes (22a through 22d) are provided on the inner side of the outer circumferential groove 27B in the vicinity of the attachment holes 21a through 21d of the respective attachment legs of the case 20B. Fixing screws 31a through 31d of the cover 30B are threaded into these screw holes.

The circuit board 40B firmly attached to an internal surface of the case 20B with a plurality of board fixing screws 41 includes circuit components, such heating components 42, electronic components 44, and tall components 45, mounted on the both surfaces. Also, a soft heat-conducting material 43 is applied to a space between the heating components 42 and internal walls of the heat releasing fins 23B. The tall components 45, such as a capacitor and an electromagnetic component, are disposed in a portion positioned at a midpoint of a pair of the connector housings 24Ba and 24Bb where a ceiling surface of the case 20B is high. The other circuit components, that is, the electronic components 44, such as surface-mounted components, are disposed at many points on the both surfaces of the circuit board 40B. A pair of the connector housing 24Ba and 24Bb is provided as an integral part of the case 20B. Connection pins 25a and 25b (25a is not shown) are press-fit into the connector housings 24Ba and 24Bb, respectively. The connection pins 25a and 25b penetrate through plated through-holes (not shown) provided to the circuit board 40B and protrude from the rear surface, so that the connection pins 25a and 25b are connected to the circuit board 40B by soldering using a jet-stream soldering device.

As is shown in FIG. 7, the cover 30B is fixed to the case 20B as the fixing screws 31a through 31d are inserted into the screw holes 22a through 22d (only reference numerals are shown) of the case 20B, respectively. An outer circumferential protruding portion 32B described below with reference to FIG. 8 is provided along the outer circumference of the cover 30B and an outer circumferential groove 27B to be filled with a seal material 28 described below with reference to FIG. 8 is provided along the outer circumference of the case 20B. The outer circumferential protruding portion 32B is inserted in a loose-fit state in the outer circumferential groove 27B in the same manner as in the first embodiment above.

Now referring to FIG. 8 that is an enlarged cross section of a hermetically sealing portion S formed between the case 20B and the cover 30B, dimensional relations of the outer circumferential groove 27B provided to the case 20B and the outer circumferential protruding portion 32B provided to the cover 30B are established in the same manner as in FIG. 4. It should be noted, however, that a slope portion 36 is provided to the inner-side internal wall surface of the outer circumferential groove 27B and the slope portion 36 is formed in such a manner that a clearance to the internal wall surface of the outer circumferential protruding portion 32B starts to increases from a depth position exceeding the tip clearance G1 from the bottom surface of the outer circumferential groove 27B. The slope portion 36 is provided so as to form a part of the outer circumferential groove 27B and serves also as a part of the opposing portion 37.

In the description above, the connector housing 24Ba and 24Bb protrude from the ceiling surface of the case 20B and straight pins orthogonal to the circuit board 40B are used as the connection pins 25a and 25b. It should be appreciated, however, that the connector housings may protrude from a side of the case and right-angle connection pins having a portion orthogonal to the circuit board and a portion parallel to the circuit board may be used as the connection pins. In addition, the attachment legs may be provided integrally with the heat-releasing fins 23B formed of a heat-conducting member. In this case, not only does it become possible to radiate and convectively diffuse heat generated in the heating components 42 from the heat-releasing fins 23B, but it also becomes possible to diffuse heat by transferring the heat to the attachment surface via the attachment legs.

Hereinafter, an assembling method of the casing according to the second embodiment of the invention will be described in detail with reference to the flowchart of FIG. 9. In FIG. 9, steps same as those of FIG. 5 are labeled with step numbers of 500's. Herein, Steps different from those of FIG. 5 and labeled with step numbers of 900's will be described. Referring to FIG. 9, Step 900 following assembly starting Step 500 is a step in which it is determined whether heat-conducting heat-releasing fins 23B are integrally molded with the resin case 20B. In a case where the former is integrally molded with the latter, a determination of YES is made and the flow proceeds to Step 501. Otherwise, a determination of NO is made and the flow proceeds to Step 901.

In Step 901, the case 20B having no heat-releasing fins 23B is carried-in and the heat-releasing fins 23B are firmly screwed to the case 20B via an unillustrated waterproof seal material in following Step 902.

Subsequent Steps are the same as those of FIG. 5 and the flow proceeds to assembly ending step 510 by way of connection pin press-fitting step 502a, heat-conducting material applying step 504, circuit board attaching step 505b, connection pin soldering step 506, seal material filling step 507, cover attaching step 508, and outward appearance and performance checking step 509.

It should be noted, however, that in a case where the attachment legs of the case 20B are resin molded articles, it is preferable to apply rotation stopping treatment to the fixing screws 31a through 31d used to put the case 20B and the cover 30B together into a single piece. Herein, an adhesive material is applied to the periphery of the heads of the fixing screws 31a through 31d after the cover 30B and the case 20B are put together into a single piece in Step 508. In a case where the screw holes 22a through 22d of the case 20B are sac holes having closed tip ends, it is possible to fill the screw holes 22a through 22d with a thermosetting adhesive material that exerts a bonding ability in the absence of oxygen in Step 507.

As has been described, the casing 10B according to the second embodiment of the invention is formed of the case 20B and the cover 30B each of which is of substantially a rectangular shape having at least two pairs of opposite sides and provided with the hermetically sealing portion S using the seal material 28 in the fit portion F along outer circumference portions of both of the case 20B and the cover 30B to hermetically store the circuit board 40B on which circuit components 42, 44, and 45 are mounted. Herein, the hermetically sealing portion S is formed of: the outer circumferential groove 27B provided along the fit portion F of the case 20B and the opposing surface portion 37 opposing the cover 30B and formed to continue from the upper edge portion of the inner-side internal wall of the outer circumferential groove 27B in an inward direction of the casing 10B; the planar tray portion 35 provided along the fit portion F of the cover 30B to extend with a predetermined tray clearance G2 between the tray portion 35 and the opposing surface portion 37 and the outer circumferential protruding portion 32B formed by bending to go into the outer circumferential groove 27B in a loose-fit state from the outer-side end portion of the tray portion 35; and the seal material 28 filled in a portion from the outer circumferential groove 27B to the tray clearance G2. Let W be a groove width of the outer circumferential groove 27B, B be a thickness of the outer circumferential protruding portion 32B, A be an outer clearance that is a clearance between the outer-side internal wall surface of the outer circumferential groove 27B and the external wall surface of the outer circumferential protruding portion 32B, C be an inner clearance that is a clearance between the inner-side internal wall surface of the outer circumferential groove 27B and the internal wall surface of the outer circumferential protruding portion 32B, then the groove width W is expressed as:

width groove W=outer clearance A+thickness B+inner clearance C. Also, let A0 be the outer clearance and C0 be the inner clearance when center positions of the case 20B and the cover 30B coincide with each other, then master dimensions of respective portions are set to satisfy a relation expressed as: A0>C0, without fail even when dimensions of the respective portions vary. In a case where the center positions of the case 20B and the cover 30B are biased and the inner clearance at a given position in a circumferential direction of the hermetically sealing portion S is given as C=0 and the outer clearance at this point is given as A=A0+C0, the inner clearance at a position on an opposite side to the firstly-mention position in the circumferential direction is given as C=2×C0 and the outer clearance is given as A=A0−C0. Accordingly, a fluctuation range of the outer clearance A caused by a variance of an attachment position of the cover 30B is given as A=A0±C0, so that A>0 is always ensured for the outer clearance A.

Regarding claim 2 of the invention, it is also configured in such a manner that: a predetermined tip clearance G1 is provided between a tip end surface of the outer circumferential protruding portion 32B of the cover 30B and a bottom surface of the outer circumferential groove 27B of the case 20B; and the opposing surface portion 37 of the case 20B opposes an internal wall of the tray portion 35 with the predetermined tray clearance G2 in between, and a value of the tip clearance G1 and a value of the tray clearance G2 when a cover thickness is B are set to satisfy a relation expressed as:

$$G1/B > G2/E2$$

where E2 is a tray length. Hence, as in the first embodiment above, the seal material between the outer clearance and the inner clearance is allowed to readily flow so that cover moves to make the dimension homogeneous on one hand, and on the other hand, the seal material can be prevented from flowing out from the tray portion into the case.

Also, it is configured in such a manner that the internal wall surface of the outer circumferential groove 27B opposing the internal wall surface of the outer circumferential protruding portion 32B is provided with the slope portion 36 in a direction such that a clearance to the internal wall surface of the outer circumferential protruding portion 32B starts to increase from a depth position exceeding the tip clearance G1 from the bottom surface of the outer circumferential groove 27B toward the upper edge portion of the outer circumferential groove 27B; the tray length E2 that is a length of an overlapping portion of the tray portion 35 and the opposing surface portion 37 including the slope portion 36 is a dimension larger than an external wall thickness E1 of the outer circumferential groove 27B of the case 20B; the thickness E1 of the external wall of the outer circumferential groove 27B is a dimension smaller than the width groove W of the outer circumferential groove 27B; and an overlapping depth D of the outer circumferential protruding portion 32B of the cover 30B and the outer circumferential groove 27B is a dimension equal to or larger than the width groove W of the outer circumferential groove 27B.

As has been described, regarding claim 4 of the invention, the dimensional relations are expressed as: tray length E2>external wall thickness E1, groove width W of the outer circumferential groove>external wall thickness E1, overlapping depth D≥groove width W of the outer circumferential groove.

Hence, a leakage shortest distance on the waterproof seal surface is secured by the overlapping depth D of the outer circumferential groove and the tray length E2 including the slope portion. Accordingly, it becomes possible to further reduce an outer shape dimension of the casing by reducing the external wall thickness E1 to the minimum possible extent.

Also, because the slope portion is provided to the internal wall surface of the outer circumferential groove, even when the inner clearance C is reduced to zero as the attachment position of the cover varies, it becomes possible to secure the seal surface by the tray length including the slope portion.

The assembling method of a casing according to the second embodiment of the invention is an assembling method of the casing described above configured in such a manner that: the case 20B is a resin molded article to which the connector housings 24Ba and 24Bb are integrally provided; the heat-releasing fins 23B formed of a heat-conducting member is integrally molded with the case 20B or integrally attached to the case 20B; a height H of the outer circumferential wall of the outer circumferential groove 27B provided to the case 20B is higher than the external surface position of the tray portion 35 provided to the cover 30B and a fixing portion of the circuit board 40B installed to the case 20B is provided at a position protruding step-wise and higher than the opposing surface portion 37 opposing the tray portion 35. According to the assembling method, steps as follows are sequentially performed: the connection pin press-fitting step 502a or 503b of press-fitting the connection pins 25a and 25b into the connector housings 24Ba and 24Bb, respectively; the heat-conducting material applying step 504 of applying the heat conducting material 43 on internal surfaces of the heat-releasing fins 23B forming a part of the case 20B in a surface opposing the heat-generating component 42 that is a part of the circuit components 42, 44, and 45 mounted on the circuit board 40B; the circuit board attaching step 505b of attaching and fixing the circuit board 40B on which are mounted the circuit components 42, 44, and 45 to an opening internal surface of the case 20B; the connection pin soldering step 506 of connecting the connection pins 25a and 25b to the circuit board 40B by soldering; and the seal material filling step 507 of filling the outer circumferential groove 27B of the case 20B with the waterproof seal material 28. Thereafter, the cover 30B is attached and fixed to the case 20B in the cover attaching step 508. A filling amount of the seal material 28 is managed so that the seal material 28 pushed out from the outer clearance A that is a clearance between the outer-side internal wall surface of the outer circumferential groove 27B and the external wall surface of the outer circumferential protruding portion 32B provided to the cover 30B does not overflow from the external wall of the case 20B having the external wall height H.

It should be appreciated that the respective embodiments above can be combined freely either partially or entirely and modifications and omissions can be made to the respective embodiments within the scope of the invention as the need arises.

What is claimed is:

1. A casing comprising a case and a cover each of which is of substantially a rectangular shape having at least two pairs of opposite sides and provided with a hermetically sealing portion using a seal material in a fit portion along outer circumference portions of both of the case and the cover to hermetically store a circuit board on which circuit components are mounted, wherein:

the hermetically sealing portion is formed of,
    an outer circumferential groove provided along the fit portion of the case and an opposing surface portion opposing the cover and formed to continue from an upper edge portion of an inner-side internal wall of the outer circumferential groove in an inward direction of the casing,
    a planar tray portion provided along the fit portion of the cover to extend with a predetermined tray clearance G2 between the tray portion and the opposing surface portion and an outer circumferential protruding portion formed by bending to go into the outer circumferential groove in a loose-fit state from an outer-side end portion of the tray portion, and
    the seal material filled in a portion from the outer circumferential groove to the tray clearance G2;

let W be a groove width of the outer circumferential groove, B be a thickness of the outer circumferential protruding portion, A be an outer clearance that is a clearance between an outer-side internal wall surface of the outer circumferential groove and an external wall surface of the outer circumferential protruding portion, C be an inner clearance that is a clearance between an inner-side internal wall surface of the outer circumferential groove and an internal wall surface of the outer circumferential protruding portion, then the groove width W is expressed as:

width groove *W*=outer clearance *A*+thickness *B*+inner clearance *C*;

let A0 be the outer clearance and C0 be the inner clearance when center positions of the case and the cover coincide with each other, then master dimensions of respective portions are set to satisfy a relation expressed as: A0>C0, without fail even when dimensions of the respective portions vary;

in a case where the center positions of the case and the cover are biased and the inner clearance at a given position in a circumferential direction of the hermetically sealing portion is given as C=0 and the outer clearance at this point is given as A=A0+C0, the inner clearance at a position on an opposite side to the position in the circumferential direction is given as C=2×C0 and the outer clearance is given as A=A0−C0;

a fluctuation range of the outer clearance A caused by a variance of an attachment position of the cover is given as A=A0±C0, so that A>0 is always ensured for the outer clearance A along the outer circumference portions of both of the case and the cover;

a tray length E2 that is a length of an overlapping portion of the tray portion and the opposing surface portion of the case is a dimension larger than an external wall thickness E1 of the outer circumferential groove of the case;

the external wall thickness E1 of the outer circumferential groove is a dimension smaller than the groove width W of the outer circumferential groove; and an overlapping depth D of the outer circumferential protruding portion of the cover and the outer circumferential groove is a dimension equal to or larger than the groove width W of the outer circumferential groove.

2. The casing according to claim 1, wherein a predetermined tip clearance G1 is provided between a tip end surface of the outer circumferential protruding portion of the cover and a bottom surface of the outer circumferential groove of the case; and the opposing surface portion of the case opposes an internal wall of the tray portion with the predetermined tray clearance G2 in between; and a value of the tip clearance G1 and a value of the tray clearance G2 when a cover thickness is B are set to satisfy a relation expressed as:

*G*1/*B*>*G*2/*E*2.

3. The casing according to claim 2, wherein the internal wall surface of the outer circumferential groove opposing the internal wall surface of the outer circumferential protruding portion is provided with a slope portion in a direction such that a clearance to the internal wall surface of the outer circumferential protruding portion starts to increase from a depth position exceeding the tip clearance G1 from the bottom surface of the outer circumferential groove toward the upper edge portion of the outer circumferential groove;

the tray length E2 that is a length of an overlapping portion of the tray portion and the opposing surface portion including the slope portion is a dimension larger than an external wall thickness E1 of the outer circumferential groove of the case;

the external wall thickness E1 of the outer circumferential groove is a dimension smaller than the width groove W of the outer circumferential groove; and an overlapping depth D of the outer circumferential protruding portion of the cover and the outer circumferential groove is a dimension equal to or larger than the width groove W of the outer circumferential groove.

4. The casing according to claim 1, wherein attachment holes used to fix the casing are provided to attachment legs provided to the outer circumference portion of the case on an outer side of the outer circumferential groove;

screw holes used to fix the cover to the case are provided in close proximity to the attachment holes on an inner side of the outer circumferential groove and an inner groove bypassing the outer circumferential groove is provided to surround a periphery of the screw holes;

clearance holes to which the fixing screws are inserted are provided to flat portions that are regions obtained by inwardly expanding a predetermined portion of the tray portion; and the flat portions abut on a waterproof seal material filled in the inner groove.

5. The casing according to claim 1, wherein the circuit board is attached and fixed to the case with board fixing screws and the cover is fixed to the case with fixing screws; and stopper portions provided to the cover oppose screw heads of the board fixing screws with a clearance in between when the cover is attached to the case so that the board fixing screws are prevented from falling off in case the board fixing screws are loosened.

6. An assembling method of the casing set forth in claim 1, wherein the case is formed of one of a case to which a heat-conducting member provided with integrally-molded heat-releasing fins, and a connector housing molded from resin are integrally attached to the case, and a case to which a connector housing molded from resin is integrally-molded, and the heat-releasing fins formed of a heat-conducting member are provided in one of a manner that the heat-releasing fins are integrally molded with the case and a manner that the heat-releasing fins are integrally attached to the case;

a height H of an outer circumferential wall of the outer circumferential groove provided to the case is higher than an external surface position of the tray portion provided to the cover and a fixing portion of the circuit board installed to the case is provided at a position protruding step-wise and higher than the opposing surface portion opposing the tray portion;

steps sequentially performed comprising:

a connection pin press-fitting step of press-fitting a connection pin into the connector housing, a heat-conducting material applying step of applying a heat conducting material on internal surfaces of the heat-releasing fins forming a part of the case in a surface opposing a heat-generating component that is a part of the circuit components mounted on the circuit board, a circuit board attaching step of attaching and fixing the circuit board on which are mounted the circuit components to an opening internal surface of the case, a connection pin soldering step of connecting the connection pin to the circuit board by soldering, and a seal material filling step of filling the outer circumferential groove of the case with a waterproof seal material;

thereafter, the cover is attached and fixed to the case in a cover attaching step; and a filling amount of the seal material is managed so that the seal material pushed out from the outer clearance A that is a clearance between the outer-side internal wall surface of the outer circumferential groove and the external wall surface of the outer circumferential protruding portion provided to the cover does not overflow from the external wall of the case having the external wall height H.

7. The assembling method of the casing according to claim 6, wherein in the circuit board attaching step, the circuit board is attached and fixed to the case with board fixing screws;

in the seal material filling step, the seal material is applied to a periphery of heads of the board fixing screws as a rotation stopping adhesive material; and when the cover is attached in the cover attaching step, stopper portions provided to the cover oppose the heads of the board fixing screws with a clearance in between to prevent the board fixing screws from falling off in case the board fixing screws are loosened.

8. The assembling method of the casing according to claim 6, wherein the outer circumferential groove provided to the case is provided to a position on an outer side of screw holes in which fixing screws used to fix the cover are threaded;

an inner groove bypassing a detoured portion of the outer circumferential groove is provided to surround the screw holes;

the cover is obtained by pressing a sheet metal material and includes the tray portion orthogonal to the outer circumferential protruding portion and flat portions formed in regions obtained by expanding a part of the tray portion and provided with clearance holes to which the fixing screws are inserted;

in the seal material filling step, the outer circumferential groove and the inner groove are filled with a waterproof seal material; and when the cover and the case are firmly screwed to each other with the fixing screws in the cover attaching step, the flat portions abut on the waterproof seal material filled in the inner groove.

* * * * *